United States Patent [19]
Mikagi

[11] Patent Number: 5,899,720
[45] Date of Patent: May 4, 1999

[54] PROCESS OF FABRICATING SALICIDE STRUCTURE FROM HIGH-PURITY REPRODUCIBLE COBALT LAYER WITHOUT SACRIFICE OF LEAKAGE CURRENT AND BREAKDOWN VOLTAGE OF P-N JUNCTION

[75] Inventor: Kaoru Mikagi, Tokyo, Japan

[73] Assignee: NEC Corporation, Tokyo, Japan

[21] Appl. No.: 08/577,748

[22] Filed: Dec. 22, 1995

[30] Foreign Application Priority Data

Dec. 28, 1994 [JP] Japan ................................... 6-327889

[51] Int. Cl.⁶ .......................... H01L 21/28; H01L 21/335
[52] U.S. Cl. .......................... 438/303; 438/655; 438/681; 438/683; 438/906
[58] Field of Search .......................... 437/200, 415 M; 438/649, 683, 682, 586, 906, 233, 299, 301, 303, 592, 651, 655, 360, 907, 681, 680; 427/123, 124

[56] References Cited

U.S. PATENT DOCUMENTS

| | | | |
|---|---|---|---|
| 4,647,361 | 3/1987 | Bauer | 204/298 |
| 5,130,172 | 7/1992 | Hicks et al. | 427/252 |
| 5,372,850 | 12/1994 | Uchikawa et al. | 427/255.3 |
| 5,403,434 | 4/1995 | Moslehi | 156/643 |
| 5,403,620 | 4/1995 | Kaesz et al. | 427/252 |
| 5,478,780 | 12/1995 | Koezner et al. | 437/190 |
| 5,563,100 | 10/1996 | Matsubara | 437/200 |

FOREIGN PATENT DOCUMENTS 2114809  8/1983  United Kingdom.

OTHER PUBLICATIONS

Search Report of GB 9526450 3.
"A Manufacturable Process for the Formation of Self Aligned Cobalt Silicide in a Sub Micrometer CMOS Technology", Berti, C., et al., Jun. 9–10, 1992, VMIC Conf., pp. 267–273.
"Formation of Self–Aligned TiN/CoSi2 Bilayer from Co/Ti/Si and Its Applications in Salicide, Diffusion Barrier and Contact Fill", Wei, C. S., et al., Jun. 12–13, 1990, VMIC Conf., pp. 233–239.

*Primary Examiner*—T. N. Quach
*Attorney, Agent, or Firm*—Laff, Whitesel, Conte & Saret, Ltd.

[57] ABSTRACT

A cobalt disilicide layer is formed on a silicon layer through an etching of natural oxide grown on the silicon layer, a deposition of a cobalt layer by using a chemical vapor deposition, a conversion of the cobalt layer on the silicon layer to a cobalt suicide layer mainly composed of CoSi, an etching of the remaining cobalt layer and a conversion of the cobalt silicide layer to a cobalt disilicide layer, and the etching of the natural oxide to the conversion to the cobalt silicide are carried out in a vacuum ambience without breakage of the vacuum so that the cobalt disilicide does not penetrate into the silicon layer.

8 Claims, 5 Drawing Sheets

PROCESS OF FABRICATING SALICIDE STRUCTURE FROM HIGH-PURITY REPRODUCIBLE COBALT LAYER WITHOUT SACRIFICE OF LEAKAGE CURRENT AND BREAKDOWN VOLTAGE OF P-N JUNCTION

FIELD OF THE INVENTION

This invention relates to a process of fabricating a salicide structure and, more particularly, to a process of fabricating a salicide structure from a high-purity cobalt layer.

DESCRIPTION OF THE RELATED ART

The salicide structure is a laminated structure of a polysilicon film and a refractory metal silicide, and is sometimes called as "self-aligned silicide structure". The salicide structure is incorporated in a MOS (Metal-Oxide-Semiconductor) field effect transistor. For example, a gate electrode of the MOS field effect transistor is implemented by the salicide structure, and a polysilicon strip is overlain by a titanium disilicide ($TiSi_2$) layer. Moreover, an impurity region is also formed in the salicide structure, and is also overlain by the titanium disilicide layer. The salicide structure drastically decreases the resistance along a signal wiring partially serving as the gate electrode and the resistance along the impurity region, and accelerates the signal propagation therealong.

The semiconductor integrated circuit device has been progressively miniaturized, and the following phenomena take place. First, the structure of the titanium disilicide tends to be shifted from C49 phase to C54 phase due to heavily doped arsenic in the n-type impurity region and the doped polysilicon strip and large stress exerted thereto along the periphery. Second, when the titanium disilicide film is formed on a shallow impurity region, the titanium disilicide film is aggregated through a rapid thermal treatment. These phenomena increases the resistance of the salicide structure.

However, if the titanium disilicide film is replaced with a cobalt disilicide ($CoSi_2$) film, the salicide structure does not increase the resistance, and Antonio C. Berti proposes the salicide structure in "A MANUFACTURABLE PROCESS FOR THE FORMATION OF SELF ALIGNED COBALT SILICIDE IN A SUB MICROMETER CMOS TECHNOLOGY", Proceedings of 1992 IEEE VLSI Multi-Level Interconnection Conference, pages 267 to 273. Antonio's process is illustrated in FIGS. 1A to 1C of the drawings.

The prior art process starts with preparation of a p-type silicon substrate 1, and a field oxide layer 2 is selectively grown on a major surface of the p-type silicon substrate 1 by using the LOCOS (Local Oxidation of Silicon) process. The field oxide layer 2 defines an active area in the major surface of the p-type silicon substrate 1. A silicon oxide layer is thermally grown to 11 nanometers thick on the active area, and a non-doped polysilicon layer is deposited over the entire surface of the structure. An appropriate photo-resist mask (not shown) is provided on the non-doped polysilicon layer by using a lithography, and the non-doped polysilicon layer is partially etched away so as to form a non-doped polysilicon gate electrode. Silicon oxide is formed from tetraethyl orthosilicate, which is abbreviated as "TEOS", and is deposited over the entire surface of the structure. The silicon oxide layer is anisotropically etched, and a gate oxide layer 3a and side-wall spacers 3c are left beneath the non-doped gate electrode and on both surfaces of the non-doped polysilicon gate electrode 3b.

Arsenic is ion implanted at dose of $5.0 \times 10^{15}$ $cm^{-2}$ into the active area. Then, the ion-implanted arsenic forms heavily doped n-type impurity regions 3d and 3e in a self-aligned manner with the side-wall spacers 3c, and converts the non-doped polysilicon gate electrode to a heavily doped n-type polysilicon gate electrode 3b. Natural oxide films 4 cover the surfaces of the heavily doped n-type impurity regions 3d and 3e and the upper surface of the doped polysilicon gate electrode 3b. The resultant structure is illustrated in FIG. 1A.

The natural oxide films 4 are etched away in hydrofluoric acid. Thereafter, cobalt is sputtered to 20 nanometers thick over the entire surface, and the cobalt layer is subjected to a first rapid thermal treatment in nitrogen atmosphere at 475 degrees centigrade. Cobalt silicide (CoSi) layers 5a and 5b are formed in a self-aligned manner with the heavily doped n-type impurity regions 3d/3e and the heavily-doped polysilicon gate electrode 3b, and the cobalt layer 5c is partially left on the field oxide layer 2 and the side-wall spacers 3c as shown in FIG. 1B.

The remaining cobalt layer 5c are selectively removed by using a wet etching. The cobalt silicide layers 5a and 5b are subjected to a second rapid thermal treatment in the nitrogen atmosphere at 700 degrees centigrade, and are converted to cobalt disilicide ($CoSi_2$) layers 5d and 5e as shown in FIG. 1C. The cobalt disilicide layers 5d and 5e are 70 nanometers thick.

Thus, the cobalt is converted to the cobalt disilicide through the rapid thermal treatment repeated twice. If the cobalt is converted to the cobalt disilicide through only one rapid thermal treatment, the prolonged rapid thermal treatment undesirably coverts the cobalt on the side-wall spacers 3c to the cobalt silicide. This is because of the fact that the silicidation of the cobalt proceeds very fast. If the cobalt on the side-wall spacers 3c is even partially converted to the cobalt silicide, the wet etching can not remove the cobalt silicide on the side-wall spacers 3c, and a short-circuit is liable to take place between the heavily doped n-type impurity regions 3d/3e and the doped polysilicon gate electrode 3b. For this reason, the rapid thermal treatment is divided into the pre-etching rapid thermal treatment and the post-etching rapid thermal treatment.

Another prior art silicidation technique is disclosed by Chih-Shih Wei et. al. in "FORMATION OF SELF-ALIGNED TiN/$CoSi_2$ BILAYER FROM Co/Ti/Si AND ITS APPLICATIONS IN SALICIDE, DIFFUSION BARRIER AND CONTACT FILL", Proceedings of 1990 IEEE VLSI Multilevel Interconnection Conference, pages 233 to 239. According to the paper, a titanium layer is formed on a silicon substrate before a sputtering of cobalt. A d.c magnetron sputtering is used for the cobalt, and the titanium layer is overlain by the cobalt layer. The multi-level structure is rapidly annealed in nitrogen atmosphere, and the cobalt layer is converted to a cobalt disilicide layer.

The silicon substrate is usually covered with natural oxide. However, while the heat is applying to the multi-level structure, the titanium getters the oxygen at the boundary between the silicon substrate and the cobalt layer, and migrates through the cobalt layer together with the oxygen. The titanium is finally converted to a titanium nitride layer on the cobalt disilicide layer, and the oxygen is eliminated from the boundary between silicon substrate and the cobalt layer.

Even though the cobalt disilicide layer is miniaturized, the cobalt disilicide layer does not increase the resistivity, and is suitable for an ultra large scale integration. However, the cobalt disilicide layer produced through the prior art processes encounter the following problems.

First, the salicide structure produced through the prior art process proposed by Antonio et. al. suffers from large leakage current and low breakdown voltage. Even though the natural oxide is etched in the hydrofluoric acid before the sputtering of cobalt, it is difficult to perfectly remove the natural oxide, because the natural oxide is grown again during the wet etching. The natural oxide remains between the heavily doped n-type impurity regions 3d/3e and the cobalt layer and between the doped polysilicon gate electrode 3b and the cobalt layer. While the cobalt layer is converted to the cobalt silicide during the first rapid heat treatment, the oxygen roughens the surface portions of the heavily doped n-type impurity regions 3d/3e, and forms the rough boundaries between the heavily doped n-type impurity regions 3d/3e and the cobalt silicide layers 5a. Moreover, the conversion to the cobalt disilicide increases the volume, and the cobalt disilicide layers 5d penetrate into the heavily doped n-type impurity regions 3d/3e after the second rapid thermal treatment. For this reason, the rough boundaries become closer to the p-n junctions 6 between the heavily doped n-type impurity regions 3d/3e and the p-type silicon substrate 1, and the remaining heavily doped n-type impurity regions 3d/3e are extremely thin. This results in the large amount of leakage current and the low breakdown voltage.

The prior art process proposed by Chih-Shih Wei is free from the large leakage current and the low breakdown voltage due to the rough boundaries. However, the second prior art process encounters a problem in low-purity cobalt and poor reproducibility. As described hereinbefore, the cobalt is deposited on the titanium layer by using the d.c. magnetron sputtering. However, cobalt is ferromagnetic, and a high-purity cobalt target does not allow a magnet unit to stably rotate in the sputtering chamber. Moreover, the cobalt target is eroded during the sputtering, and the erosion changes the distribution of magnetic force around the cobalt target. The unstable distribution of magnetic force is causative of varied sputtering speed, and the cobalt layer is hardly reproducible.

If a low-purity cobalt target is used for the sputtering, the reproducibility is improved. However, the cobalt layer is low in purity, and the low-purity cobalt layer affects the quality of the cobalt disilicide layer.

Of course, another physical vapor deposition technique is available for the cobalt layer, and is known as an electron beam source evaporation system. However, the electron beam tends to damage the circuit components on the semiconductor substrate such as an extremely thin gate oxide layer of a MOS type field effect transistor, and is not desirable for a semiconductor integrated circuit device having miniature field effect transistors.

Thus, the second prior art process encounters the trade-off between the purity and the reproducibility, and can not produce a cobalt disilicide from a high-purity cobalt layer in good reproducibility.

SUMMARY OF THE INVENTION

It is therefore an important object of the present invention to provide a process of fabricating a wiring structure from a high-purity reproducible cobalt layer without sacrifice of leakage current and breakdown voltage at a p-n junction thereunder.

To accomplish the object, the present invention proposes to carry out a removal of natural oxide and a chemical vapor deposition of cobalt without a breakage of vacuum.

In accordance with the present invention, there is provided a process of fabricating a cobalt disilicide layer, comprising the steps of: a) preparing a semiconductor structure having a silicon layer; b) removing a natural oxide layer on the silicon layer in a vacuum ambience; c) keeping the semiconductor structure in vacuum between the step b) and the next step d); d) depositing a cobalt layer on the silicon layer by using a chemical vapor deposition carried out in vacuum ambience; and e) converting the cobalt layer through a cobalt silicide layer to a cobalt disilicide layer.

The natural oxide layer be removed by using hydrogen plasma or gaseous mixture containing hydrogen fluoride The cobalt may be produced through a decomposition of a cobalt organic compound selected from the group consisting of $Co(C_5H_5)_2$, $Co(CH_3C_5H_4)_2$, $Co(CH_3COCH_3COCH_3)_2$, $Co((CH_3)_3 CCOCH_4)_2$ and $Co(C_5HF_6O_2)_2$.

BRIEF DESCRIPTION OF THE DRAWINGS

The features and advantages of the process of fabricating a wiring structure according to the present invention will be more clearly understood from the following description taken in conjunction with the accompanying drawings in which.

DESCRIPTION OF THE PREFERRED EMBODIMENTS

First Embodiment

Figure 1A:
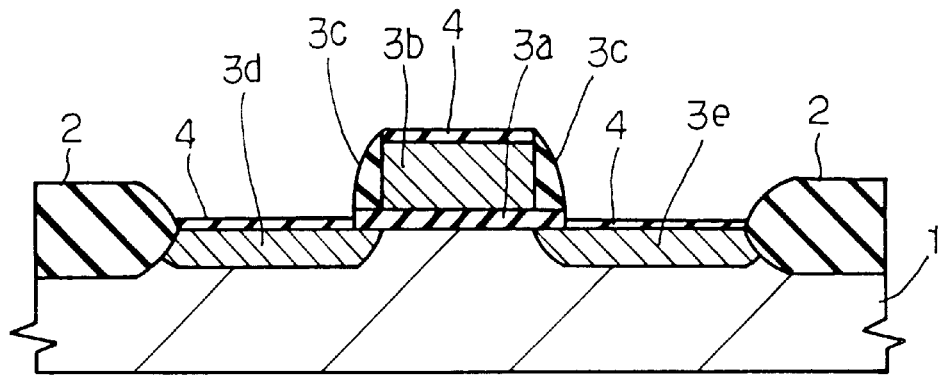
FIGS. 1A to 1C are cross sectional views showing the prior art process of fabricating the salicide structure.
Figure 1B:
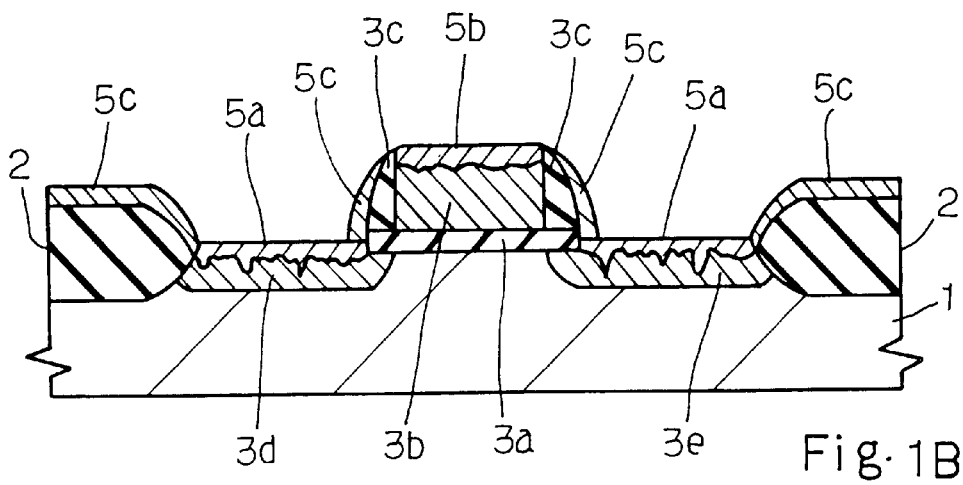
Figure 1C:
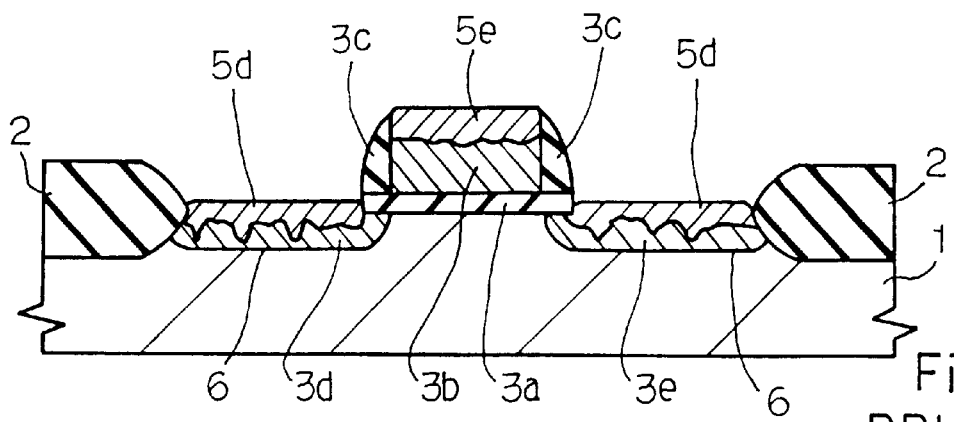

FIGS. 2A to 2D show a process sequence for fabricating a field effect transistor embodying the present invention.

The process starts with preparation of a p-type silicon substrate 11, and a field oxide layer 12 is grown to 400 nanometers thick over an isolation area in a major surface of the p-type silicon substrate 11 by using the LOCOS. The field oxide layer 12 defines an active area in the major surface, and a field effect transistor 13 is fabricated on the active area.

Silicon oxide is thermally grown to 8 nanometers thick on the active area, and non-doped polysilicon is deposited to 150 nanometers thick over the entire surface of the structure. An appropriate photo-resist mask (not shown) is provided on the non-doped polysilicon layer by using a lithography, and the non-doped polysilicon layer is patterned into a non-doped gate electrode. The gate width or a channel length is 0.25 micron.

Silicon oxide is deposited to 80 nanometers thick over the entire surface of the structure by using a high temperature vapor phase deposition, and the silicon oxide layer is etched back without a photo-resist mask. A gate oxide layer 13a is formed beneath the non-doped polysilicon gate electrode, and side-wall spacers 13b are provided on both sides of the non-doped polysilicon gate electrode.

Arsenic is ion implanted at dose of $1.0 \times 10^{15}$ $cm^{-2}$ to $5.0 \times 10^{15}$ $cm^{-2}$ under the acceleration energy of 50 KeV, and the implanted arsenic is activated in nitrogen atmosphere at 900 degrees centigrade for 15 to 20 minutes. The non-doped polysilicon gate electrode is converted to a doped polysilicon gate electrode 13c, and heavily doped n-type impurity regions 13d and 13e are formed in a self-aligned manner with the side-wall spacers 13b. The heavily doped n-type impurity regions 13d and 13e form p-n junctions around 0.15 micron in depth.

Undesirable natural oxide (not shown) has been grown on the surfaces of the heavily doped n-type impurity regions 13d and 13e and the surface of the doped polysilicon gate electrode 13c. The natural oxide is removed through a wet etching using hydrofluoric acid as an etchant. However, even though the hydrofluoric acid removes the natural oxide, fresh surfaces of the heavily doped impurity regions 13d/13e and the doped polysilicon gate electrode 13c are exposed to the air, and natural oxide (not shown) is grown to several nanometers thereon again.

The p-type silicon substrate 11 is placed into a chamber 14a of a cobalt film deposition system 14. The cobalt film deposition system 14 further includes a vacuum pump 14b, a plasma generator 14c, a gas source 14d and a substrate heater 14e.

Figure 2A:
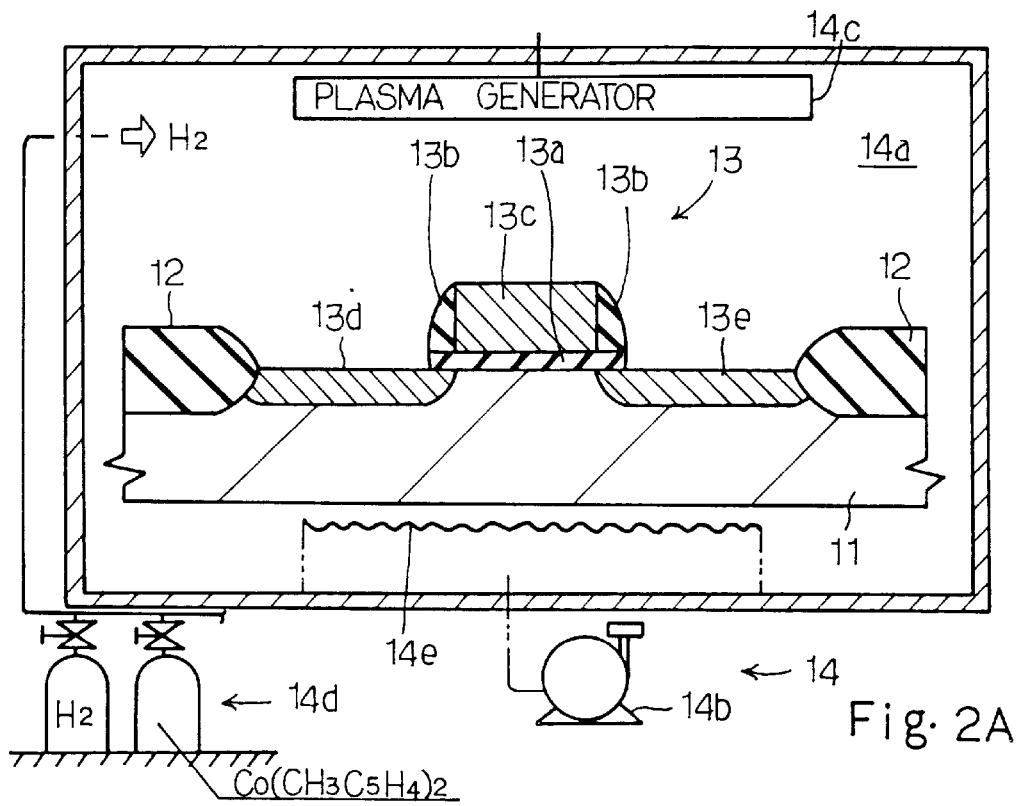
FIGS. 2A to 2D are cross sectional views showing a process sequence for fabricating a field effect transistor having a salicide structure according to the present invention.

The vacuum pump 14b evacuates the chamber 14a, and the substrate heater 14e heats the p-type silicon substrate 11 at 300 to 600 degrees centigrade. The gas source 14d supplies hydrogen gas at 0.3 to 2.6 Pa, and the plasma generator 14c generates hydrogen plasma at 0.4 to 1.0 kw. The natural oxide is exposed to the hydrogen plasma, and is removed from the heavily doped n-type impurity regions 13d/13e and the doped polysilicon gate electrode 13c. Thus, the exposed silicon/polysilicon surfaces are cleaned, and fresh silicon/polysilicon surfaces appear as shown in FIG. 2A.

Even after the plasma cleaning is completed, the vacuum pump 14b maintains the vacuum in the chamber 14a, and the fresh silicon/polysilicon surfaces are never oxidized again.

Subsequently, the gas source 14d vaporizes bis-methyl-cyclopenta-dienyl-cobalt expressed by the chemical formula "$Co(CH_3C_5H_4)_2$", and the bis-methyl-cyclopenta-dienyl-cobalt gas is carried on hydrogen gas. The gaseous mixture is supplied to the chamber 14a. The hydrogen carrier gas is regulated 100 to 400 sccm, and the bis-methyl-cyclopenta-dienyl-cobalt gas is regulated to 10 to 40 sccm. The gaseous mixture is maintained at 13 to 52 Pa in the chamber, and the p-type silicon substrate 11 is heated to 200 to 400 degrees centigrade. Cobalt is produced from the bis-methyl-cyclopenta-dienyl-cobalt gas through the pyrolysis, and is deposited to 10 to 20 nanometers thick on the entire surface of the structure.

In this instance, the plasma clearing and the chemical vapor deposition are carried out in the same vacuum chamber 14a. However, the plasma cleaning and the chemical vapor deposition may be carried out in different vacuum chambers in so far as the p-type silicon substrate is conveyed without breakage of the vacuum.

The fusing point of the bis-methyl-cyclopenta-dienyl-cobalt is 37 degrees centigrade, and the bis-methyl-cyclopenta-dienyl-cobalt has the vapor pressure of about 400 Pa at 80 degrees centigrade. For this reason, the bis-methyl-cyclopenta-dienyl-cobalt is available for the chemical vapor deposition. The cobalt is deposited at 20 to 40 nanometers per minute under the above described deposition conditions, and the pyrolysis is dominated by the flow rate of the bis-methyl-cyclopenta-dienyl-cobalt gas. The low deposition rate is desirable for a growth of an extremely thin layer. The substrate temperature has little influence on the deposition rate, and the chemical vapor deposition is not affected by a magnetic field and an electron-beam radiation. Thus, the chemical vapor deposition is available for the reproducible growth of the high-purity thin cobalt layer.

Even after the chemical vapor deposition, the chamber 14a is maintained in vacuum, and the substrate heater 14e heats the cobalt layer at 400 to 550 degrees centigrade for 10 to 30 seconds. The heat converts the cobalt layer on the heavily doped n-type impurity regions 13d/13e and the doped polysilicon gate electrode 13c to cobalt silicide expressed as $Co_xSi_y$, where x and y are integers. The cobalt silicide layers 15a and 15b are self-aligned with the heavily doped n-type impurity regions 13d/13e and the doped polysilicon gate electrode 13c.

Figure 2B:
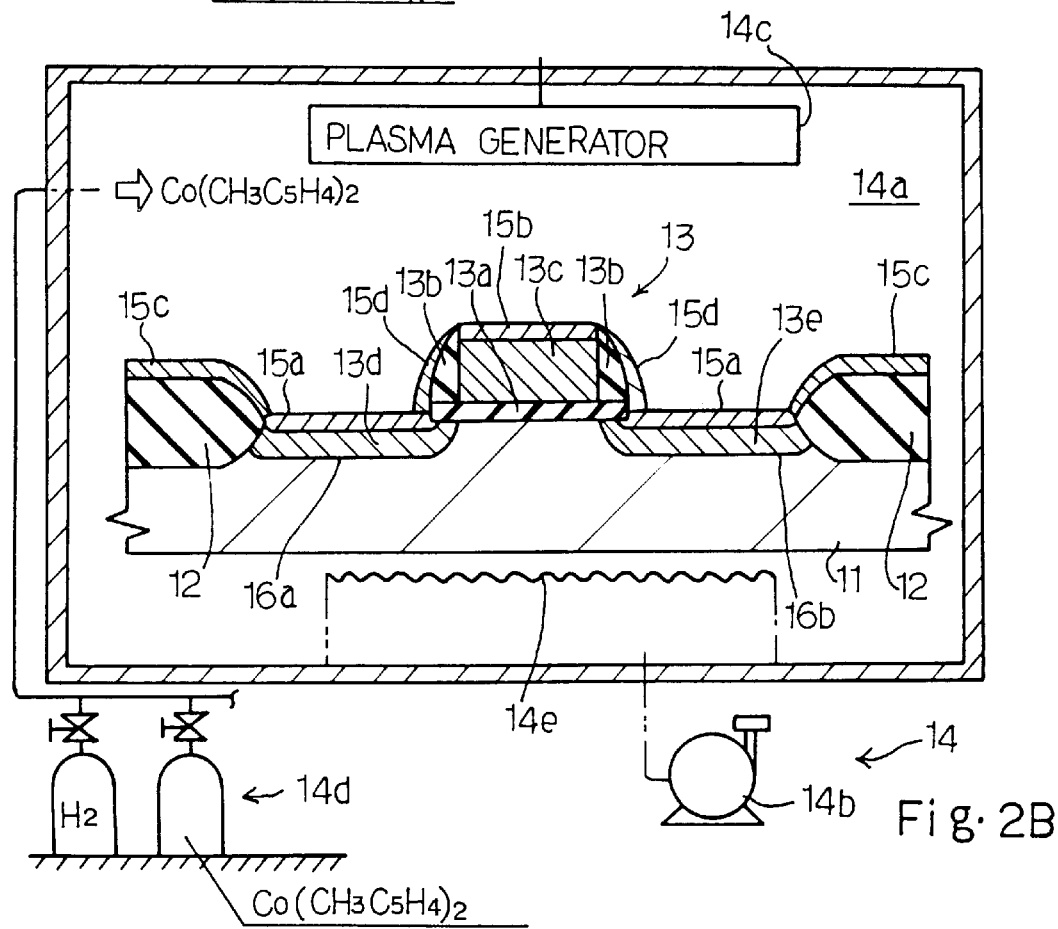

The cobalt silicide layers 15a and 15b are mainly composed of CoSi, and contain $CoSi_2$ and $Co_2Si$. However, the field oxide layer 12 and the side-wall spacers 13b are still overlain by the remaining cobalt layers 15c and 15d as shown in FIG. 2B.

Although the silicidation is carried out in the same vacuum chamber 14a, another vacuum chamber may be used for the silicidation in so far as the vacuum is not broken.

The boundaries between the cobalt silicide layers 15a and 15b and the impurity regions/gate electrode 13d/13e/13c are smooth, and the cobalt silicide layers 15a and 15b are uniform in thickness, because the natural oxide has been perfectly removed. Moreover, the thickness of the cobalt silicide layers 15a and 15b is predictable and controllable, because the cobalt layer is pure and reproducible by selecting the deposition conditions. In this instance, the cobalt silicide layers 15a and 15b are 20 to 40 nanometers thick.

The p-n junctions 16a/16b between the impurity regions 13d/13e and the silicon substrate 11 are also predictable, and uniformly extend under the cobalt silicide layers 15a and 15b.

The p-type silicon substrate 11 is taken out from the chamber 14a, and the residual cobalt layers 15c and 15d are removed from the field oxide layer 12 and the side-wall spacers 13b by using a wet etching. The etchant is formed from sulfuric acid ($H_2SO_4$) and hydrogen peroxide ($H_2O_2$).

Figure 2C:
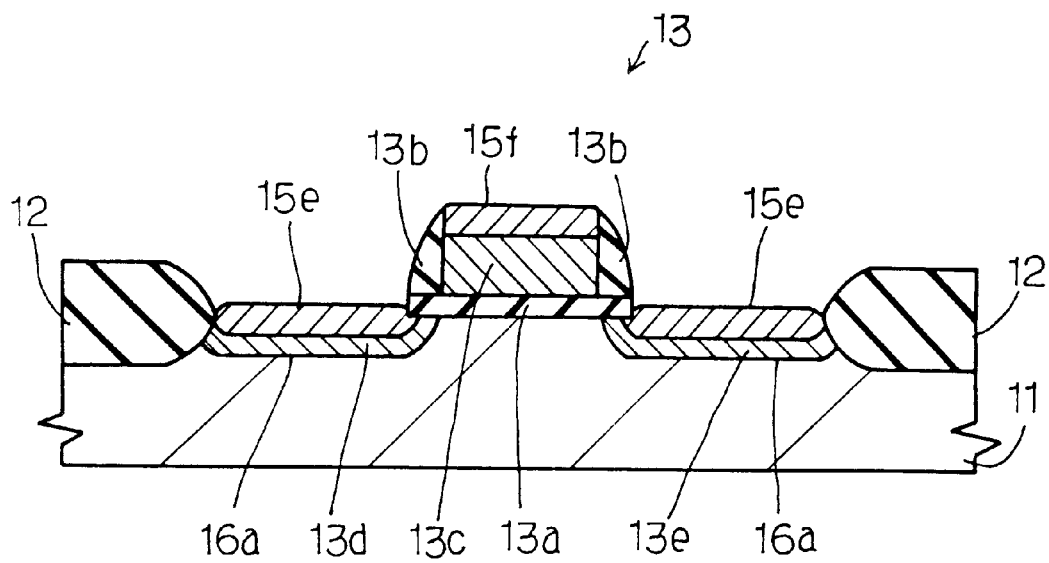

Thereafter, the cobalt silicide layers 15a and 15b are subjected to a heat treatment in inert atmosphere by using the substrate heater at 600 to 800 degrees centigrade for 10 to 30 seconds. The cobalt silicide layers 15a and 15b shift the phase from $Co_xSi_y$ to $CoSi_2$. $CoSi_2$ is stable, and the heavily doped n-type impurity regions 13d/13e and the doped polysilicon gate electrode 13c are overlain by the cobalt disilicide layers 15e and 15f as shown in FIG. 2C. The cobalt is converted to the cobalt disilicide through the two-stage heat treatment, and the reason for the two-stage heat treatment is identical with the first prior art process. Namely, the two-stage heat treatment prevents the field effect transistor 13 form undesirable short-circuit between the heavily doped n-type impurity regions 13d/13e and the doped polysilicon gate electrode 13c through silicon disilicide undesirably converted from the cobalt on the side-wall spacers 13b.

The boundaries between the cobalt disilicide layers 15e and 15f and the impurity regions 13d/13e/ the gate electrode 13c are not roughened in the conversion from the cobalt silicide to the cobalt disilicide, and are smooth as similar to the boundaries with the cobalt silicide layers 15a/15b. The cobalt disilicide layers 15e/15f are also uniform in thickness, and range 35 to 70 nanometers thick.

The p-n junctions 16a/16b are also uniformly extend under the cobalt disilicide layers 25e and 25f, and are 0.125 to 0.10 micron in depth. For this reason, the distance between the cobalt disilicide layers 15e and the p-n junctions 16a/16b is constant, and the leakage current and the breakdown voltage at the p-n junctions 16a/16b fall within respective expected ranges. Thus, the field effect transistor 13 is free from unexpected large leakage current and unexpected low breakdown voltage, and the production yield is surely improved.

Subsequently, silicon oxide is deposited to 100 nanometers thick by using an atmospheric pressure chemical vapor deposition at 400 degrees centigrade, and, thereafter, boro-phosphosilicate-glass is deposited to 2 microns thick through a low pressure chemical vapor deposition by using tetraethyl orthosilicate at 400 degrees centigrade. As a result, the structure shown in FIG. 2C is overlain by an inter-level insulating structure 17, i.e., the silicon oxide layer and the boro-phosphosilicate-glass layer.

First contact holes and a second contact hole (not shown) are formed in the inter-level insulating structure 17 by using the lithographic techniques and an etching process, and are 0.4 micron square. The first contact holes reach the cobalt disilicide layers 15e, and the second contact hole reaches the cobalt disilicide layer 15f over the field oxide layer 12.

Subsequently, titanium nitride is deposited over the entire surface of the structure by using a reactive sputtering, and is 50 to 100 nanometers thick on the upper surface of the inter-level insulating structure 17. Tungsten is further deposited by using a hydrogen reduction technique or a silane reduction technique. The tungsten layer is etched back by using a reactive ion etching or chemical-mechanical polishing, and the contact holes are plugged with pieces of tungsten 18a and 18b.

Figure 2D:
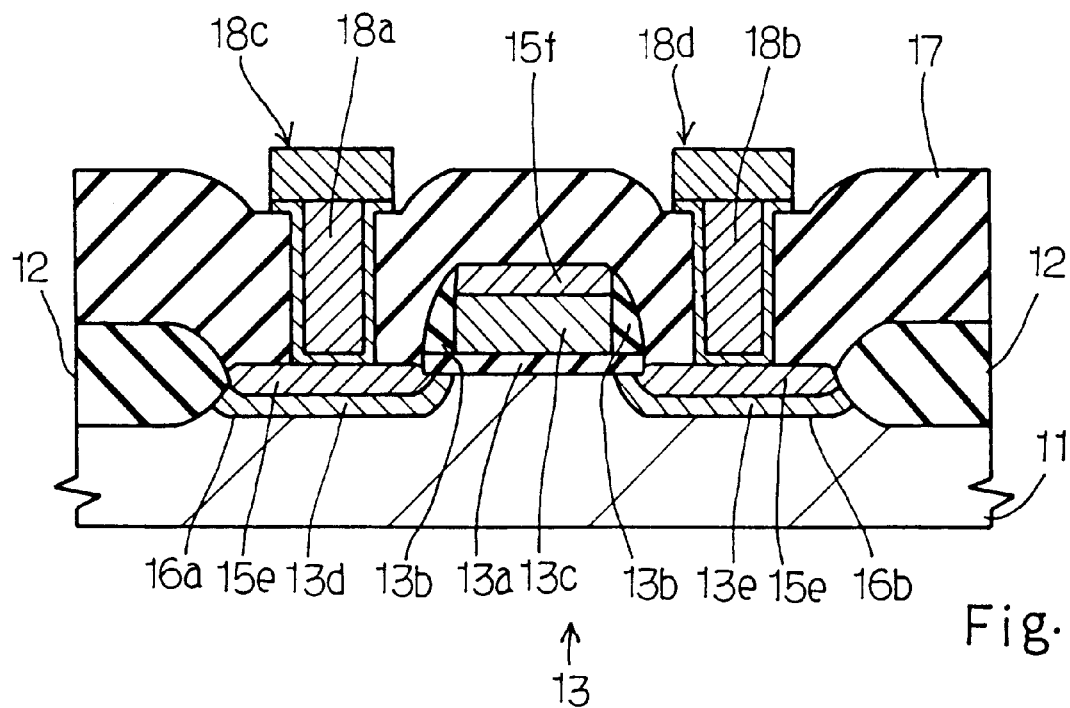

Subsequently, aluminum-based alloy is deposited over the entire surface of the structure, and the aluminum-based alloy contains copper at 0.1 to 0.5 weight percent. An appropriate photo-resist mask is provided on the aluminum-based alloy layer, and the aluminum-based alloy layer and the titanium nitride layer are patterned into wirings 18c and 18d as shown in FIG. 2D. The field effect transistor 13 is connected through the wirings 18c and 18d to other circuit components, and forms a part of an integrated circuit.

Though now shown in the drawings, a passivation layer is formed over the entire surface of the resultant structure shown in FIG. 2D, and the semiconductor integrated circuit device is completed.

As will be understood from the foregoing description, the cobalt layer is deposited through the chemical vapor deposition, and the cobalt layer is well controllable by selecting the deposition conditions without sacrifice of the purity of cobalt. The cobalt disilicide layers are converted from the reproducible pure cobalt layer, and are also reproducible.

Moreover, the vacuum is not broken from the removal of the natural oxide to the first heat treatment for the conversion to the cobalt silicide layers 15a and 15b, and the boundaries between the cobalt silicide layers 15a/15b and the impurity regions 13d/13e are never roughened by residue of the natural oxide. For this reason, the cobalt disilicide layers 15e and 15f are constant in thickness, and are spaced from the p-n junctions 16a and 16b by a predetermined distance. For this reason, the field effect transistor 13 is free from large leakage current and low breakdown voltage at the p-n junctions 16a and 16b.

Second Embodiment

Turning to FIGS. 3A to 3D illustrate another process sequence for fabricating a field effect transistor embodying the present invention. The process implementing the second embodiment differs from a removal of natural oxide and process gas for the chemical vapor deposition.

The process starts with preparation of a p-type silicon substrate 21, and a field oxide layer 22 is grown to 400 nanometers thick over an isolation area in a major surface of the p-type silicon substrate 21 by using the LOCOS. The field oxide layer 22 defines an active area in the major surface, and a field effect transistor 23 is fabricated on the active area.

Silicon oxide is thermally grown to 8 nanometers thick on the active area, and non-doped polysilicon is deposited to 150 nanometers thick over the entire surface of the structure. An appropriate photo-resist mask (not shown) is provided on the non-doped polysilicon layer by using a lithography, and the non-doped polysilicon layer is patterned into a non-doped gate electrode. The gate width or a channel length is 0.25 micron.

Silicon oxide is deposited to 80 nanometers thick over the entire surface of the structure by using a high temperature vapor phase deposition, and the silicon oxide layer is etched back without a photo-resist mask. A gate oxide layer 23a is formed beneath the non-doped polysilicon gate electrode, and side-wall spacers 23b are provided on both sides of the non-doped polysilicon gate electrode.

Arsenic is ion implanted into the active area by using the non-doped polysilicon gate electrode as a mask, and the implanted arsenic is activated at 900 degrees centigrade. The non-doped polysilicon gate electrode is converted to a doped polysilicon gate electrode 23c, and heavily doped n-type impurity regions 23d and 23e are formed in the active area in a self-aligned manner with the side-wall spacers 23b. The heavily doped n-type impurity regions 23d and 23e form p-n junctions around 0.15 micron in depth.

Undesirable natural oxide (not shown) has been grown on the surfaces of the heavily doped n-type impurity regions 23d and 23e and the surface of the doped polysilicon gate electrode 23c. The natural oxide is removed through a wet etching using hydrofluoric acid as an etchant. However, even though the hydrofluoric acid removes the natural oxide, fresh surfaces of the heavily doped impurity regions 23d/23e and the doped polysilicon gate electrode 23c are exposed to the air, and natural oxide (not shown) is grown to several nanometers thereon again.

The p-type silicon substrate 21 is placed into a vacuum chamber where vacuum is developed. The p-type silicon substrate 21 is heated to 25 to 100 degrees centigrade, and the natural oxide is exposed to hydrogen fluoride anhydride gas. The natural oxide is reduced by the hydrogen fluoride anhydride gas, and the natural oxide is removed from the surfaces of the heavily doped n-type impurity regions 23d/23e and the surface of the heavily doped gate electrode 23c. Thus, the hydrogen fluoride anhydride gas cleans the surfaces of the heavily doped n-type impurity regions 23d/23e and the surface of the heavily doped gate electrode 23c.

The reduction in the hydrogen fluoride anhydride is desirable, because the field effect transistor 23 is not damaged by plasma.

After the cleaning, the p-type semiconductor substrate 21 is conveyed from the vacuum chamber to another vacuum chamber without breakage of vacuum. In other words, while conveying the p-type silicon substrate 21, the p-type silicon substrate 21 is maintained in vacuum ambience, and the fresh silicon/polysilicon surfaces are never oxidized again. The reason why the chemical vapor deposition is carried out in the vacuum chamber different from that of the cleaning is to prevent the cobalt layer from residual hydrogen fluoride anhydride gas.

Subsequently, bis-cyclopenta-dienyl-cobalt expressed by the chemical formula "Co($C_5H_5$)$_2$" is vaporized, and hydrogen gas carries the bis-cyclopenta-dienyl-cobalt gas to the vacuum chamber. The hydrogen carrier gas is regulated 100 to 400 sccm, and the bis-cyclopenta-dienyl-cobalt gas is regulated to 10 to 40 sccm. The gaseous mixture is maintained at 13 to 52 Pa in the vacuum chamber, and the p-type silicon substrate 21 is heated to 350 to 400 degrees centigrade. The bis-cyclopenta-dienyl-cobalt is decomposed, and cobalt is deposited to 10 to 20 nanometers thick on the entire surface of the structure.

The fusing point of the bis-cyclopenta-dienyl-cobalt is higher than that of the bis-methyl-cyclopenta-dienyl-cobalt at 37 degrees centigrade, and is 174 degrees centigrade. The bis-cyclopenta-dienyl-cobalt has the vapor pressure of about 10 Pa at 100 degrees centigrade, and the bis-cyclopenta-dienyl-cobalt is heated to higher temperature than the bis-methyl-cyclopenta-dienyl-cobalt. The cobalt is deposited at 20 to 40 nanometers per minute under the above described deposition conditions, and the pyrolysis is dominated by the flow rate of the bis-cyclopenta-dienyl-cobalt gas. The substrate temperature has little influence on the deposition rate, and the chemical vapor deposition is not affected by a magnetic field and an electron-beam radiation. Thus, the chemical vapor deposition using the bis-cyclopenta-dienyl-cobalt is available for the reproducible growth of the high-purity thin cobalt layer.

After the chemical vapor deposition, the chamber is maintained in vacuum, and a substrate heater heats the cobalt layer at 400 to 550 degrees centigrade for 10 to 30 seconds. The heat converts the cobalt layer on the heavily doped n-type impurity regions 23d/23e and the doped polysilicon gate electrode 23c to cobalt silicide expressed by $Co_xSi_y$, where x and y are integers. The cobalt silicide layers 25a and 25b are self-aligned with the heavily doped n-type impurity regions 23d/23e and the doped polysilicon gate electrode 23c.

Figure 3A:
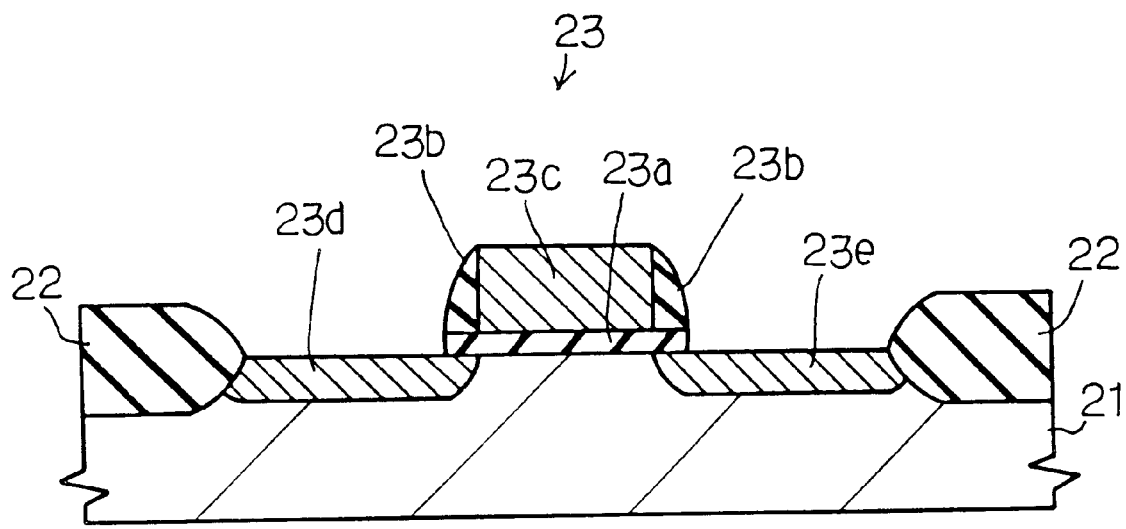
FIGS. 3A to 3D are cross sectional views showing another process sequence for fabricating a field effect transistor having a salicide structure according to the present invention.
Figure 3B:
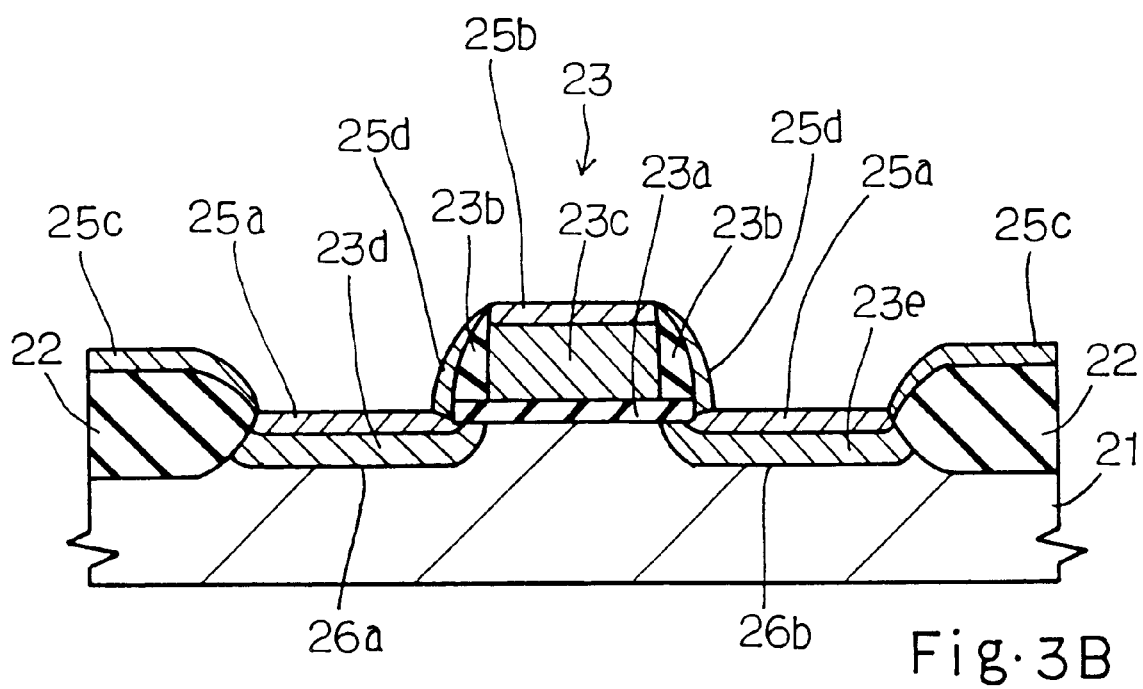

The cobalt silicide layers 25a and 25b are mainly composed of CoSi, and contain $CoSi_2$ and $Co_2Si$. However, the field oxide layer 22 and the side-wall spacers 23b are still overlain by the remaining cobalt layers 25c and 25d as shown in FIG. 3B.

Although the silicidation is carried out in the same vacuum chamber 14a as the chemical vapor deposition, yet another vacuum chamber may be used for the silicidation in so far as the vacuum is not broken.

The boundaries between the cobalt silicide layers 25a and 25b and the impurity regions/gate electrode 23d/23e/23c are smooth, and the cobalt silicide layers 15a and 15b are constant in thickness, because the natural oxide has been perfectly removed. Moreover, the thickness of the cobalt silicide layers 25a and 25b is predictable and controllable, because the cobalt layer is pure and reproducible by selecting the deposition conditions. In this instance, the cobalt silicide layers 25a and 25b are 20 to 40 nanometers thick.

The p-n junctions 26a/26b between the impurity regions 23d/23e and the silicon substrate 21 are also predictable, and uniformly extend under the cobalt silicide layers 25a and 25b.

The p-type silicon substrate 21 is taken out from the chamber, and the residual cobalt layers 25c and 25d are removed from the field oxide layer 22 and the side-wall spacers 23b by using a wet etching. The etchant is formed from sulfuric acid ($H_2SO_4$) and hydrogen peroxide ($H_2O_2$).

Figure 3C:
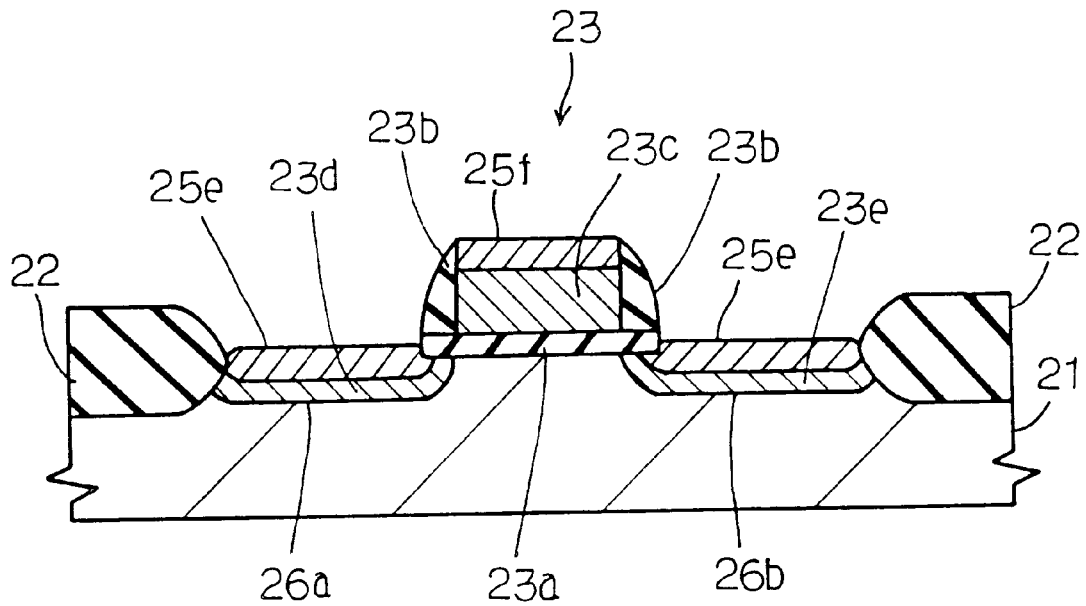

Thereafter, the cobalt silicide layers 25a and 25b are subjected to a heat treatment in inert atmosphere by using a substrate heater at 600 to 800 degrees centigrade for 10 to 30 seconds. The cobalt silicide layers 25a and 25b shift the phase from $Co_xSi_y$ to $CoSi_2$. $CoSi_2$ is stable, and the heavily doped n-type impurity regions 23d/23e and the doped polysilicon gate electrode 23c are overlain by the cobalt disilicide layers 25e and 25f as shown in FIG. 3C.

The boundaries between the cobalt disilicide layers 25e and 25f and the impurity regions 23d/23e/ the gate electrode 23c are not roughened in the heat treatment for the conversion from the cobalt silicide to the cobalt disilicide, and are smooth as similar to the boundaries with the cobalt silicide layers 25a/25b. The cobalt disilicide layers 25e/25f are also constant in thickness, and range 35 to 70 nanometers thick.

The p-n junctions 26a/26b are also uniformly extend under the cobalt disilicide layers 25e and 25f, and are 0.125 to 0.10 micron in depth. For this reason, the distance between the cobalt disilicide layers 25e and the p-n junctions 26a/26b is constant, and the leakage current and the breakdown voltage at the p-n junctions 26a/26b fall within respective expected ranges. Thus, the field effect transistor 23 is free from unexpected large leakage current and unexpected low breakdown voltage, and the production yield is surely improved.

Subsequently, silicon oxide is deposited to 100 nanometers thick by using an atmospheric pressure chemical vapor deposition at 400 degrees centigrade, and, thereafter, boro-phosphosilicate-glass is deposited to 2 microns thick through a low pressure chemical vapor deposition by using tetraethyl orthosilicate at 400 degrees centigrade. As a result, the structure shown in FIG. 3C is overlain by an inter-level insulating structure 27, i.e., the silicon oxide layer and the boro-phosphosilicate-glass layer.

First contact holes and a second contact hole (not shown) are formed in the inter-level insulating structure 27 by using the lithographic techniques and an etching process, and are 0.4 micron square. The first contact holes reach the cobalt disilicide layers 25e, and the second contact hole reaches the cobalt disilicide layer 25f over the field oxide layer 22.

Subsequently, titanium nitride is deposited over the entire surface of the structure by using a reactive sputtering, and is 50 to 100 nanometers thick on the upper surface of the inter-level insulating structure 27. Tungsten is further deposited by using a hydrogen reduction technique or a silane reduction technique. The tungsten layer is etched back by using a reactive ion etching or chemical-mechanical polishing, and the contact holes are plugged with pieces of tungsten 28a and 28b.

Figure 3D:
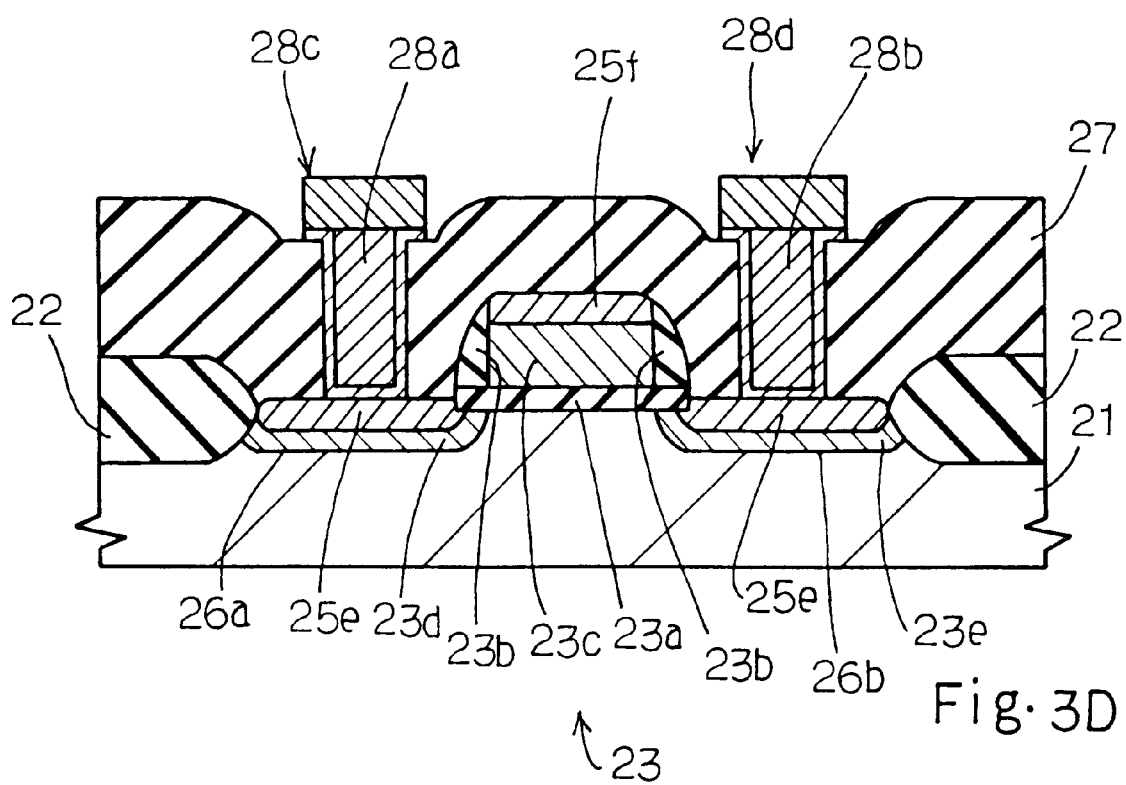

Subsequently, aluminum-based alloy is deposited over the entire surface of the structure, and the aluminum-based alloy contains copper at 0.1 to 0.5 weight percent. An appropriate photo-resist mask is provided on the aluminum-based alloy layer, and the aluminum-based alloy layer and the titanium nitride layer are patterned into wirings 28c and 28d as shown in FIG. 3D. The field effect transistor 23 is connected through the wirings 28c and 28d to other circuit components, and forms a part of an integrated circuit.

Though now shown in the drawings, a passivation layer is formed over the entire surface of the resultant structure shown in FIG. 3D, and the semiconductor integrated circuit device is completed.

As will be understood from the foregoing description, the cobalt layer is deposited through the chemical vapor deposition, and the cobalt layer is well controllable by selecting the deposition conditions without sacrifice of the purity of cobalt. The cobalt disilicide layers are converted from the reproducible pure cobalt layer, and are also reproducible.

Moreover, the vacuum is not broken from the removal of the natural oxide to the first heat treatment for the conversion to the cobalt silicide layers 25a and 25b, and the boundaries between the cobalt silicide layers 25a/25b and the impurity regions 23d/23e are never roughened by residue of the natural oxide. For this reason, the cobalt disilicide layers 25e and 25f are constant in thickness, and are spaced from the p-n junctions 26a and 26b by a predetermined distance. For this reason, the field effect transistor 23 is free from large leakage current and low breakdown voltage at the p-n junctions 26a and 26b.

In the above described first and second embodiments, the bis-methyl-cyclopenta-dienyl-cobalt and the bis-cyclopenta-dienyl-cobalt are used in the chemical vapor deposition for the cobalt layer. However, the first and second embodiments do not set a limit on the process gas. If cobalt organic compound has a high vapor pressure at lower than the first silicidation temperature ranging between 400 degrees to 550 degrees centigrade. Other available process gases are bis-acetyleacetonate-cobalt expressed as $Co(CH_3COCH_3COCH_3)_2$, bis-dipivaloyl-methanato-cobalt expressed as $Co((CH_3)_3 CCOCH_4)_2$ and bis-hexafluoro-acetyleacetonate-cobalt expressed as $Co(C_5HF_6O_2)_2$.

Although particular embodiments of the present invention have been shown and described, it will be obvious to those skilled in the art that various changes and modifications may be made without departing from the spirit and scope of the present invention.

For example, the present invention is not limited to the formation of the field effect transistor illustrated in the drawings. The field effect transistor may have an LDD (Lightly Doped Drain) structure, and may be a p-channel type.

A complementary transistor, i.e., a combination of p-channel/n-channel field effect transistors may have the salicide structure produced in accordance with the present invention. In order to fabricate the complementary transistor, an-type well and a p-type well are formed before the growth of the field oxide layer, and p-type impurity regions are formed by ion-implanting $BF_2$ at dose of $1.0 \times 10^{15}$ $cm^{-2}$ to $5.0 \times 10^{15}$ $cm^{-2}$ under acceleration energy of 20 keV after the formation of the heavily doped n-type impurity regions. While the ion-implantation is being carried out, the area assigned to the field effect transistor opposite in channel conductivity type is covered with a photo-resist layer. The heavily doped p-type impurity regions are annealed in nitrogen atmosphere at 1000 degrees centigrade for 10 to 15 seconds, and form p-n junction around 0.15 micron in depth.

The present invention is applicable to a process for fabricating another circuit component of an integrated circuit such as a bipolar transistor. The emitter electrode of the bipolar transistor may have the salicide structure according to the present invention. Only signal wirings may be formed through a process according to the present invention.

Finally, the present invention is applicable to a cobalt silicide layer formed on an impurity region exposed to a contact hole formed in an inter-level insulating layer. The impurity region is usually shallow, and the cobalt silicide layer does not penetrate through the shallow impurity region.

What is claimed is:

1. A process of fabricating a cobalt disilicide layer, comprising the steps of:

a) preparing a semiconductor structure having a silicon layer;

b) removing a natural oxide layer on said silicon layer in a vacuum ambiance created in a vacuum chamber;

c) keeping said semiconductor structure in a vacuum between said step b) and a next step d);

d) depositing a cobalt layer on said silicon layer by using a chemical vapor deposition carried out in a vacuum ambiance; and e) converting said cobalt layer through a cobalt silicide layer to a cobalt disilicide layer without breaking said vacuum in said step d).

2. The process as set forth in claim 1, in which said step a) includes the sub-steps of a-1) preparing a silicon substrate having an active area defined by a field oxide layer, a-2) forming a gate structure having a gate insulating layer on said active area, a gate electrode on said gate insulating layer and side-wall spacers provided on side surfaces of said gate electrode, and a-3) introducing a dopant impurity into said active area so as to form impurity regions self-aligned with said gate structure, said impurity regions serving as said silicon layer.

3. The process as set forth in claim 2, in which said gate electrode is formed of a polysilicon, and also serves as said silicon layer.

4. The process as set forth in claim 1, in which said step b) is carried out by exposing said natural oxide to a plasma containing hydrogen.

5. The process as set forth in claim 4, in which said plasma containing hydrogen is generated in said vacuum chamber where said chemical vapor deposition is carried out in said step d).

6. The process as set forth in claim 1, in which said chemical vapor deposition is carried out by using a process gas selected from the group consisting of bis-methyl-cyclopenta-dienyl-cobalt, bis-cyclopenta-dienyl-cobalt, bis-acetyleacetonate-cobalt, bis-dipivaloyl-methanato-cobalt and bis-hexafluoro-acetyleacetonate-cobalt.

7. The process as set forth in claim 1, in which said step e) includes the sub-steps of e-1) heating said cobalt layer in a vacuum ambience so as to convert parts of said cobalt layer on said silicon layer to a cobalt silicide layer mainly composed of CoSi, other parts of said cobalt layer remaining on said semiconductor structure except for said silicon layer, e-2) removing said other parts of said cobalt layer from said semiconductor structure, and e-3) heating said cobalt silicide layer so as to convert said cobalt layer to a cobalt disilicide layer mainly composed of $CoSi_2$.

8. A process of fabricating a salicide structure, comprising the steps of:

a) preparing a silicon substrate having an active area defined by a field oxide layer;

b) forming a gate structure having a gate insulating layer on said active area, a polysilicon gate electrode on said gate insulating layer and side-wall spacers provided on side surfaces of said polysilicon gate electrode;

c) introducing a dopant impurity into aid active area so as to form impurity regions self-aligned with said gate structure;

d) removing a natural oxide layer on said silicone layer in a vacuum ambiance created in a vacuum chamber by exposing said natural oxide to one of plasma containing hydrogen and gas containing hydrofluoride anhydride;

e) keeping said silicon substrate in said vacuum between said step d) and the next step e);

f) depositing a cobalt layer by using a chemical vapor deposition carried out in said vacuum ambiance;

g) heating said cobalt layer in said vacuum ambiance so as to convert parts of said cobalt layer on said polysilicon gate electrode and said impurity regions to a cobalt silicide layer mainly composed of CoSi without breaking said vacuum in said step e), other parts of said cobalt layer remaining on said at least said field oxide layer and said side-wall spacers;

h) removing said other parts of said cobalt layer; and i) heating said cobalt silicide layer so as to convert said cobalt layer to a cobalt disilicide layer mainly composed of $CoSi_2$.

* * * * *